(12) United States Patent
Narukawa et al.

(10) Patent No.: US 6,455,446 B2
(45) Date of Patent: Sep. 24, 2002

(54) HIGH-TEMPERATURE HIGH-PRESSURE PROCESSING METHOD FOR SEMICONDUCTOR WAFERS, AND AN ANTI-OXIDIZING BODY USED FOR THE METHOD

(75) Inventors: Yutaka Narukawa, Takasago (JP); Makoto Kadoguchi, Takasago (JP)

(73) Assignee: Kobe Steel, Ltd., Kobe (JP)

( * ) Notice: Subject to any disclaimer, the term of this patent is extended or adjusted under 35 U.S.C. 154(b) by 0 days.

(21) Appl. No.: 09/788,416

(22) Filed: Feb. 21, 2001

(30) Foreign Application Priority Data

Feb. 22, 2000 (JP) ........................................ 2000-044658

(51) Int. Cl.[7] .............................................. H01L 21/324
(52) U.S. Cl. ...................................... 438/795; 106/1.13
(58) Field of Search ................................. 438/687, 761, 438/762, 765–777, 800, 92; 106/1.13, 1.18, 1.05

(56) References Cited

U.S. PATENT DOCUMENTS 4,217,374 A * 8/1980 Ovshinsky et al. ........... 438/92

\* cited by examiner

Primary Examiner—Craig Thompson
(74) Attorney, Agent, or Firm—Oblon, Spivak, McClelland, Maier & Neustadt, P.C.

(57) ABSTRACT

A high-temperature high-pressure processing method for semiconductor wafers in which semiconductor wafers are charged into a pressure vessel to carry out processing under the gas atmosphere of high-temperature high-pressure, wherein the high-temperature high-pressure processing is carried out in the state that an anti-oxidizing body (an oxygen getter member) formed of a material having properties in which oxygen is apt to diffuse into interior is arranged within the pressure vessel whereby the anti-oxidizing body takes oxygen into the pressure vessel, thus preventing oxygen within the pressure vessel from being reduced to oxidize the surfaces of the semiconductor wafers in the high-temperature high-pressure processing.

12 Claims, 3 Drawing Sheets

FIG. 1
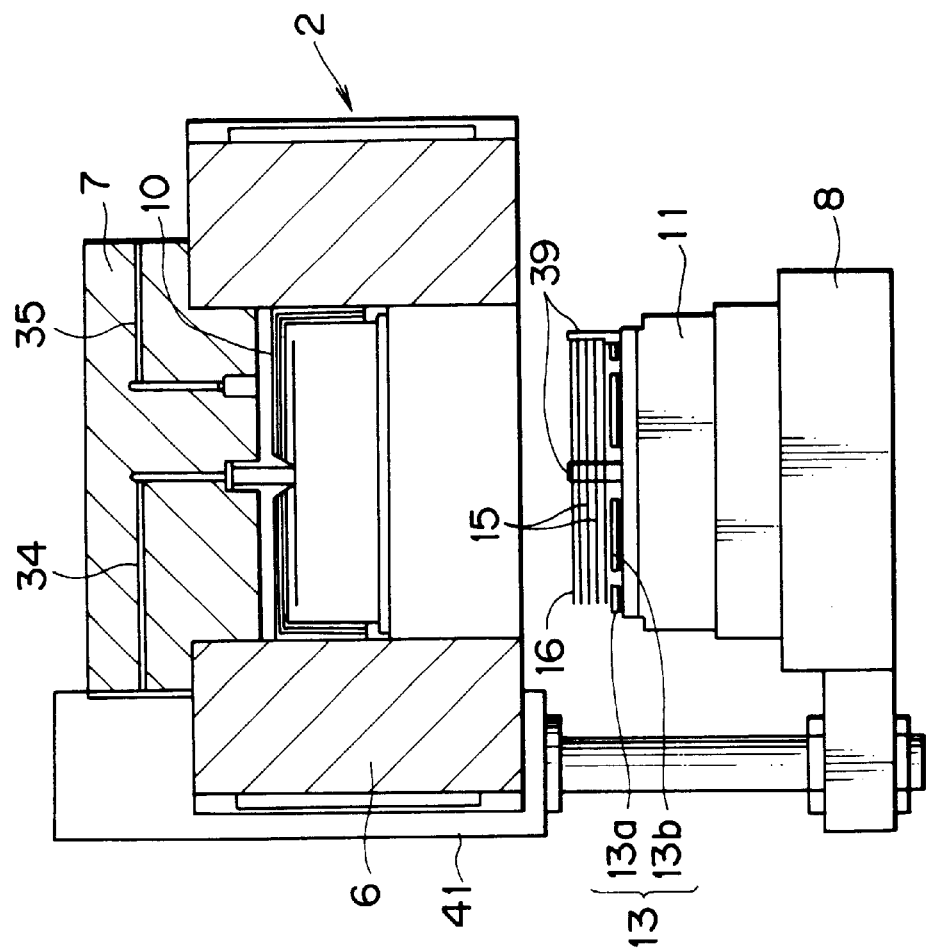
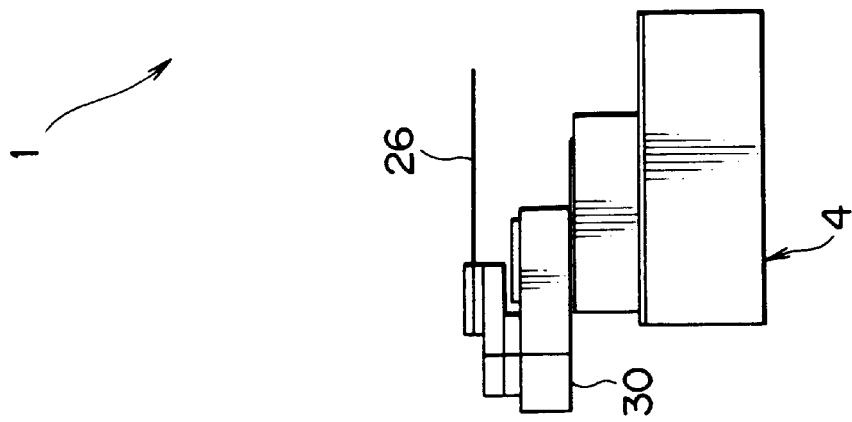

HIGH-TEMPERATURE HIGH-PRESSURE PROCESSING METHOD FOR SEMICONDUCTOR WAFERS, AND AN ANTI-OXIDIZING BODY USED FOR THE METHOD

BACKGROUND OF THE INVENTION

1. Field of the Invention

The present invention relates to a high-temperature high-pressure processing method for semiconductor wafers, and an anti-oxidizing body for the method.

2. Description of the Related Art

Copper (Cu) has been recently highlighted as a wiring material for a semiconductor device, and electrolytic plating occupies the mainstream as a film forming method thereof.

On the other hand, a finer wiring has been steadily progressed, that is, a level of $0.18\mu$ has been made practical, further, $0.15\mu$ or $0.13\mu$, and a further finer level has been tried.

However, with the fineness, it is difficult to positively embed a material deeply into a hole in a wiring film. Defects such as large and small voids sometimes occur within the wiring. Attention has now been paid to the utility of high pressure as a method for forming a sound wiring film without voids.

The utilization of high pressure is described in detail, for example, in "Application of HIP to ULSI Fabrications (A Challenge to Sub-Quarter Micron World)" (1999), Proc. Int. Conf On HIP Beijing, Chinese MRS, p276–281, T. Fujikawa et. al.

In the aforementioned process, argon gas is normally used as a pressure medium, and for example, for the soundness of Cu film-formed by electrolytic plating, temperature above 350° C. and pressure above 120 MPa are necessary.

Argon gas of 99.998% used normally contains oxygen of about 0.2 ppm and water of about 2 ppm.

Where pressure is 120 MPa, for example, the quantity of oxygen corresponds to that oxygen of about 0.02% is contained in argon gas in atmospheric pressure.

It has been found therefore that when heated to 350° C. at such a high pressure atmosphere as described, the surface of the Cu film is oxidized to an industrially injurious level by the presence of oxygen and water in argon gases.

Sometimes, the surface of a semiconductor wafer becomes discolored into black purple to lose luster, after the semiconductor wafer has been processed under high-temperature high-pressure. The present inventors have analyzed in ingredient the aforesaid surface and found that a large quantity of oxygen was detected. It was therefore found that the discoloring was caused by oxidization. It was found by SEM observation of the broken surface of the semiconductor wafer that the Cu wiring film was so sound that no void was observed.

When the surface of the semiconductor wafer is oxidized, the hardness is changed, resulting in variation of a film thickness in post step, which is CMP (chemomechanical polishing for flattening the surface). This greatly influences on the production yield of an expensive semiconductor chip. Where the oxidized contamination is great, it adversely influences on an electric specific characteristic itself Accordingly, it is extremely important that in high-temperature high-pressure processing, the surface of the semiconductor wafer not be oxidized.

It is also contemplated that for preventing the surface of the wafer from being oxidized in high-temperature high-pressure processing, for example, argon gas of 99.9999% super-high purity is used.

However, the cost of the argon gas of 99.9999% is about 7 times than that of argon gas of 99.998%, materially increasing the cost in high-temperature high-pressure processing.

Further, even the argon gas of super-high purity, since some quantity of impurity are accumulated in the argon gas every high-temperature high-pressure processing, it is difficult to recycle-use the argon gas, which results in wasteful use of resources and increase in cost.

SUMMARY OF THE INVENTION

It is an object of the present invention to provide a high-temperature high-pressure processing method capable of preventing surface contamination of a semiconductor wafer not depending on even gas of super-high purity, and an anti-oxidizing body used for the method.

According to the present invention, there is provided a high-temperature high-pressure processing method in which a semiconductor wafer is charged into a pressure vessel to process it under the gas atmosphere of high-temperature high-pressure, wherein an anti-oxidizing body (an oxygen getter member) formed of a material having properties in which oxygen is apt to diffuse into interior is subjected to high-temperature high-pressure processing in the state that the anti-oxidizing body is arranged within the pressure vessel. In this case, since the anti-oxidizing body takes in oxygen within the pressure vessel, it is possible to prevent oxygen within the pressure vessel from being reduced to oxidize the surface of a semiconductor wafer in the high-temperature high-pressure processing.

Materials for the anti-oxidizing body are preferably titanium or a titanium alloy or zirconium or a zirconium alloy.

Preferably, the high-temperature high-pressure processing is carried out in the state that semiconductor wafers and a plate-like anti-oxidizing body formed substantially in the same shape as viewed in plane as the semiconductor wafers are mixed and supported on a wafer support capable of supporting a plurality of semiconductor wafers.

In this case, when the semiconductor wafers are supported on the wafer support, the anti-oxidizing body along with the semiconductor wafers may be supported on the wafer support. Therefore, the anti-oxidizing body can be arranged within the pressure vessel easily. Preferably, the semiconductor wafers are film-formed in Cu.

The anti-oxidizing body according to the present invention is featurized in that a material having properties in which oxygen is apt to diffuse into interior is formed to be a plate-like having substantially the same shape as viewed in plane as the semiconductor wafer.

The anti-oxidizing body is made substantially the same shape as the semiconductor wafer whereby the anti-oxidizing body can be handled similarly to the semiconductor wafer. That is, it is possible to transport and support the anti-oxidizing body by means of a unit for transporting and supporting the semiconductor wafer, facilitating the handling thereof.

Preferably, the anti-oxidizing body is applied with mirror polishing processing, and preferably, the whole or a part of one surface out of both surfaces of the plate is applied with coating. Where the anti-oxidizing body is handled similarly to the semiconductor wafer, it is unavoidable that the former comes in contact with the unit for transporting and supporting the semiconductor wafer. In this case, when the anti-oxidizing body comes in contact with the unit as described, dust sometimes occurs. Particularly, in an anti-oxidizing body made of metal such as titanium, the semiconductor wafer is possibly contaminated in metal. Application of coating prevents occurrence of dust caused by the contact. Coating is preferably coating of an insulator such as ceramic coating.

BRIEF DESCRIPTION OF THE DRAWINGS

FIG. 1 is a partly sectioned front view of a high-temperature high-pressure processing apparatus;

DESCRIPTION OF THE PREFERRED EMBODIMENTS

Figure 2:
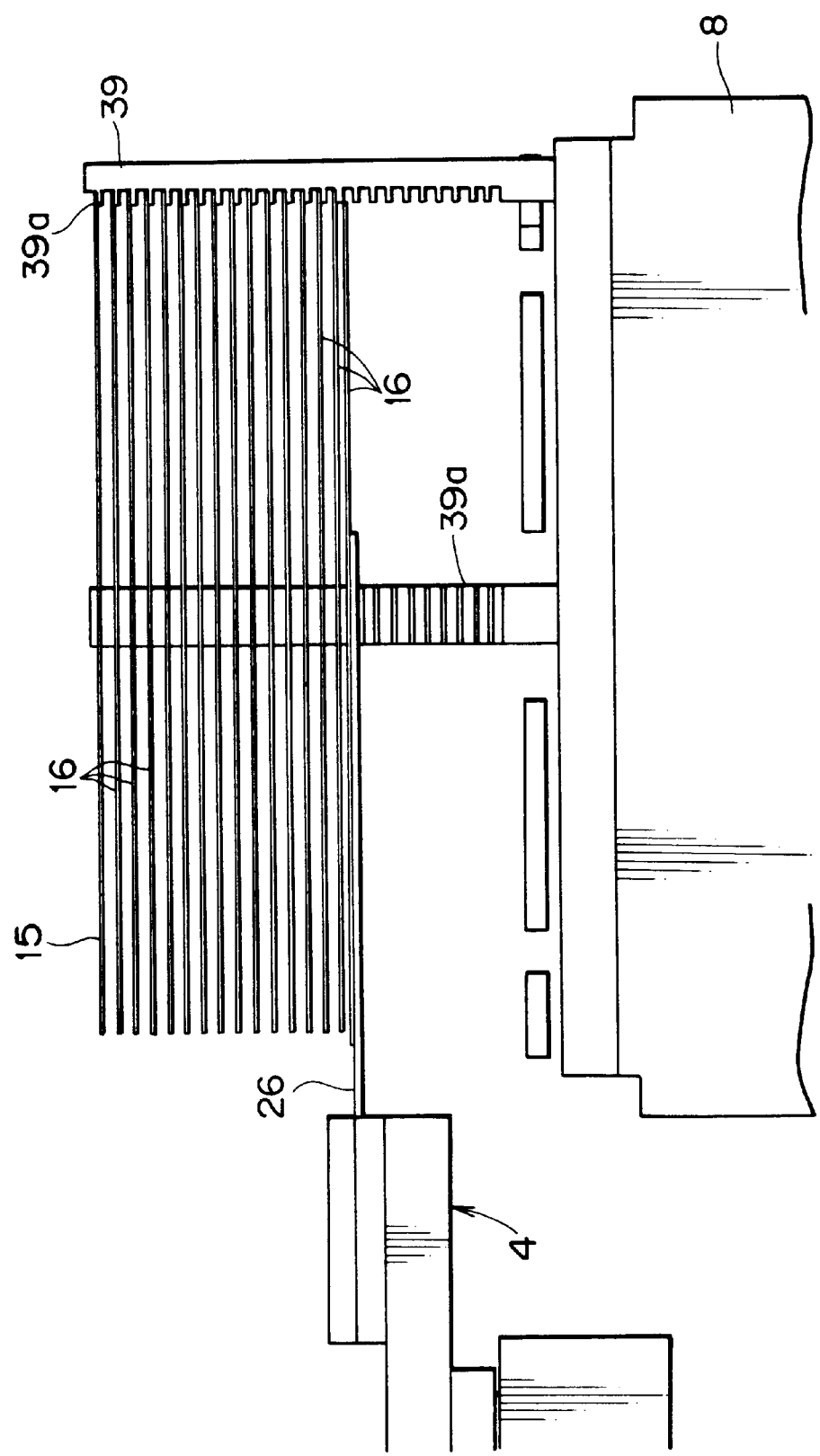
FIG. 2 is a view showing a laminating state of semiconductor wafers and anti-oxidizing body on a wafer support.

The preferred embodiments of the present invention will be described hereinafter with reference to the drawings. FIGS. 1 and 2 show a high-temperature high-pressure processing apparatus 1 for semiconductor wafers. The processing apparatus 1 is to anneal semiconductor wafers (Si wafers) under the atmosphere of high-temperature high-pressure gas, and includes a pressure vessel 2 having wafers received therein, and a wafer handler 4.

The pressure vessel 2 comprises a tubular body 6 having upper and lower openings, an upper lid 7 for closing the upper opening, and a lower lid 8 for closing the lower opening. Although not shown, there is provided a press frame for supporting an axial load acting on the upper and lower lids 7 and 8.

A heat insulating construction 10 is suspended from the upper lid 7. The heat insulating construction 10 has a plurality of inverted bowl-like members made of metal put one upon another with a clearance therebetween.

The upper lid 7 is provided with a high pressure gas introducing hole 34, and a high pressure discharging hole 35 provided independently of the former. Gas introduced into the pressure vessel 2 is supplied from a gas compressor (not shown) passing through the gas introducing hole 34. Gas within the pressure vessel 2 is discharged passing through the gas discharging hole 35.

Gas as a pressure medium used is normally argon gas, but nitrogen gas or other inactive gases can be used depending on the temperature and pressure conditions.

The heat insulating construction 10 is locked by screwing it into a side opening internally of the vessel of the gas introducing hole 34, and high pressure gas supplied from the introducing hole 34 is introduced into the inner space (processing chamber) of the heat insulating construction through a hole extending through the heat insulating construction 10.

The lower lid 8 can be moved up and down by a lower lid elevating actuator 41, and when the lower lid 8 is moved up, the lower opening of the pressure vessel 2 can be closed, whereas when the lower lid 8 is moved down, the lower opening of the pressure vessel 2 can be opened.

A heater 13 divided into two inner and outer zones (heater elements 13a and 13b) is installed on the lower lid 8 through a shield block 11 made of metal having electrodes or the like of a heating heater 13 received therein.

On the lower lid 8 is provided a wafer support (boat) 39 for supporting semiconductor wafers 15. The support 39 is made of quartz, which can support a plurality of wafers 15 in a given spaced relation vertically. The support 39 is provided with a plurality of vertical projections 39a for supporting a plurality of peripheral edges of the wafers 15 from the lower surfaces (back surfaces) of the wafers, and the wafers are placed on the projections 39a to enable supporting the wafers 15.

Work for placing or unloading the wafers 15 from the support 39 is carried out by a wafer handler (transporting means) 4. The wafer handler 4 comprises an arm 30, which rotates and expands in a direction of a horizontal surface and is movable vertically, and a hand 26 provided at the extreme end of the arm 30. The wafer handler 4 transports the wafers 15 in such a manner that the wafers 15 are raised so as to be scooped up by the hand 26.

For carrying out the high-temperature high-pressure processing using the above-described apparatus 1, the semiconductor wafers 15 formed with a wiring film (Cu wiring film) and the anti-oxidizing body 16 formed of a material which is high in oxygen activity and in which oxygen is apt to diffuse into interior are first prepared. The anti-oxidizing body (getter plates) 16 is circular plates formed to have the same diameter as that of the semiconductor wafers 15 supported by the support 39. The wafers 15 and the anti-oxidizing body 16 are in the same shape as viewed in plane. As a material for the anti-oxidizing body 16, pure titanium is used here. The anti-oxidizing body 16 is applied with mirror polishing processing to prevent occurrence of particles.

For example, ten semiconductor wafers 15 are prepared, and one anti-oxidizing body 16 is prepared. These semiconductor wafers 15 and anti-oxidizing body 16 are placed on the support 39 by the handler 4.

First, the anti-oxidizing body 16 is placed on the uppermost stage of the support 39, and then the 10 semiconductor wafers are placed under the anti-oxidizing 16 in order.

Afterwards, the lower lid 8 is moved up to charge the support 39 into the processing chamber. The pressure vessel 2 is vacuumed to a 10 Pa level. Thereafter, argon gas of 99.998% is charged by 1 MPa into the processing chamber, after which argon purging releasing it into atmosphere is repeated twice.

By these steps, air remaining in the processing chamber is reduced to about 1/1,000,000. The quantity of oxygen is at about 0.2 ppm.

Thereafter, supplying and pressurizing are carried out to be pressurized to 120 MPa at the maximum, the heater 13 is energized to effect heating up to 350° C., this state is maintained for 15 minutes under the conditions of 350° C.×120 MPa, and the high-temperature high-pressure processing is carried out.

At this time, oxygen within the processing chamber is solid-solved into the anti-oxidizing body 16 and reduced to prevent the wafers 15 from being oxidized. Accordingly, the surface of the semiconductor wafer 15 after processing is not changed in color, exhibiting luster equal to that before processing. The anti-oxidizing body 16 is installed on the uppermost stage of the support 39, but this part is highest in temperature, and the anti-oxidizing body 16 takes in oxygen efficiently.

After the high-temperature high-pressure, energization to the heater 13 is stopped to lower temperature, argon gas is discharged and reduced in temperature, and the interior of the processing chamber is returned to atmospheric pressure. Thereafter, the lower lid 8 is moved down, and the wafers 15 are removed from the pressure vessel 2, and are removed from the support 39 by t he handler 4. Since anti-oxidizing body 16 can be used repetitively, when it is reused, that can be remained as it is without being removed from the support 39.

Since the anti-oxidizing body 16 lowers (being oxidized) in ability as an absorber (a getter) of oxygen gradually due to the repetitive use, when predetermined processing times have passed, it is necessary to replace the anti-oxidizing body 16. This replacement can be also done by the wafer handler 4 similarly to the transporting of the wafers 15.

Since in the present embodiment, the anti-oxidizing body 16 is arranged to carry out the high-temperature high-pressure processing, the semiconductor wafers 15 are prevented from oxidizing. Since the anti-oxidizing body 16 is substantially the same dimension as that of the semiconductor wafer 15 to be processed, it can be handled similarly to the wafer handler 4 (robot) for handling the semiconductor wafers 15.

The sizes of the semiconductor wafers 15 are 6 inches, 8 inches (200 mm) that is the mainstream at present, and 12 inches (300 mm) that will be the mainstream in future, and so on. If the semiconductor wafer 15 to be processed is, for example, 8 inches, the anti-oxidizing body 16 used is also a circuit plate having a diameter of 8 inches.

The thickness of the anti-oxidizing body 16 is also preferably about the same as the wafer 15, but can be different from the wafer 15 if the body 16 can be supported by the support 39 and handled by the handler 4. If the body 16 is thinner than the wafer 15, no particular problem occurs. Here, the thickness of the wafer 15 is 0.75 mm whereas the thickness of the anti-oxidizing body 16 is 0.5 mm.

Figure 3:
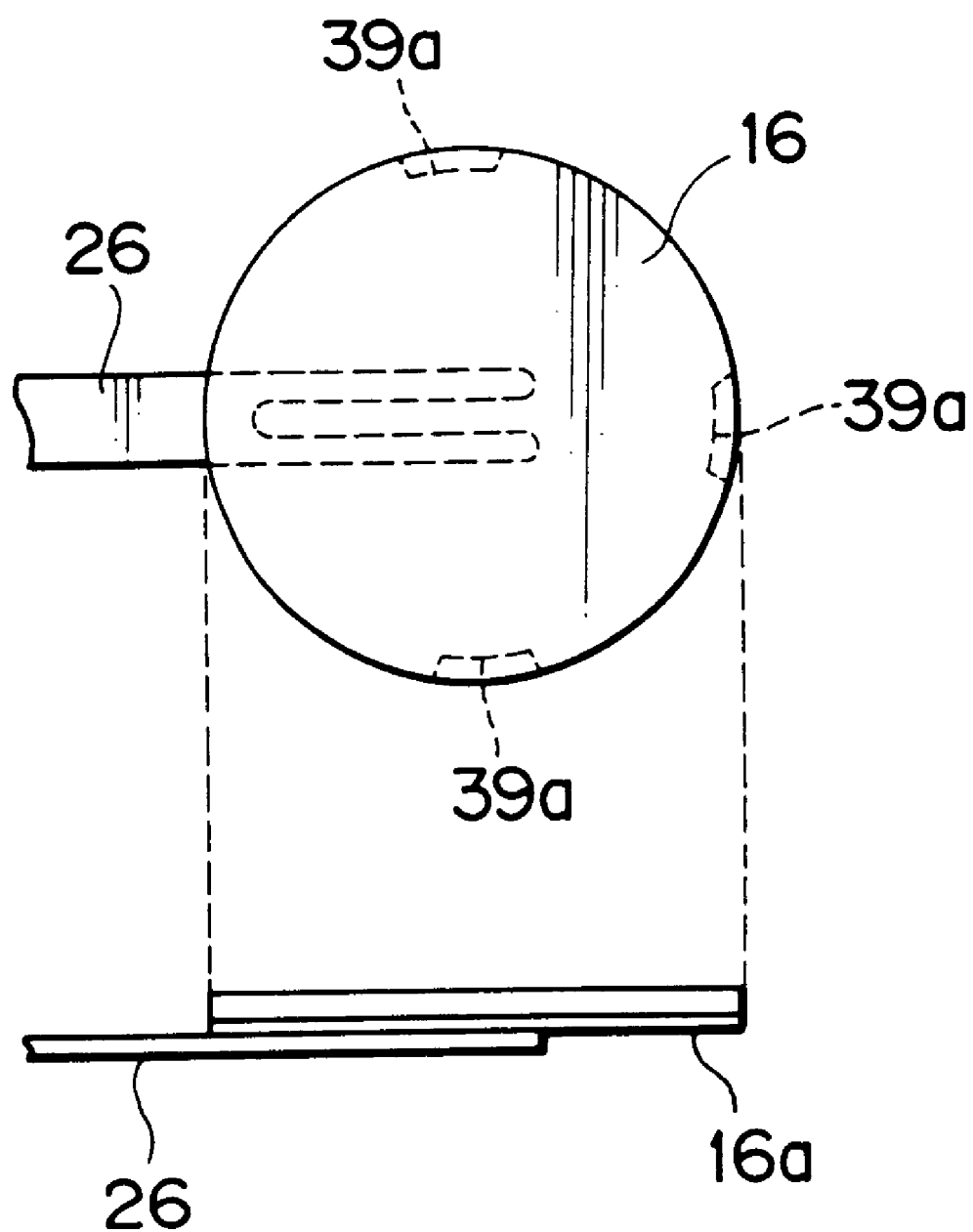
FIG. 3 is a plan view and a side view of an anti-oxidizing body.

In the present embodiment, the semiconductor wafers 15 and the anti-oxidizing body 16 are handled by the single wafer handler 4 and are placed on the single support 39 (boat). The semiconductor device detests metal contamination. Therefore, where the hand 26 of the wafer handler 4 and the projections (slot parts) 39a avoid the contact with the anti-oxidizing body 16, the whole back (lower surface) 16a of the anti-oxidizing body 16 is applied with ceramic coating. Also, the back 16a may be partly coated. The partial coating may be applied to the hand 26, hand 26 or the projections (slot parts) 39a contact(the part of the outer peripheral edge part of the anti-oxidizing body) and the neighborhood thereof (see FIG. 3).

The present invention is not limited to the above-described embodiments. For example, while in the above-described embodiments, the anti-oxidizing body 16 is arranged on the uppermost part of the support 39, it may be placed at a vertical central position of the semiconductor wafers 15. If necessary, they may be arranged at two upper and lower parts, or as the case may be, the semiconductor wafers 15 and the anti-oxidizing bodies 16 may be arranged alternately vertically. That is, the anti-oxidizing body 16 may be mixed within the semiconductor wafers 15. Any arrangement may be carried out easily by the handler 4.

In the anti-oxidizing body 16 used in the present invention, the shape thereof is not restricted. Particularly, where the anti-oxidizing body 16 is arranged at a position other than the support 39, other shapes may be employed. Even if the shape and the arrangement of the anti-oxidizing body 16 are different, the anti-oxidizing effect is similar to that of the embodiment.

We claim:

1. A high-temperature high-pressure processing method for semiconductor wafers in which semiconductor wafers are charged into a pressure vessel and processing is carried out under the gas atmosphere of high-temperature high-pressure, the method comprising the following steps:

arranging an anti-oxidizing body formed of a material having properties in which oxygen is apt to diffuse into interior into said pressure vessel; and carrying out high-temperature high-pressure processing.

2. The high-temperature high-pressure processing method for semiconductor wafers according to claim 1, wherein high-temperature high-pressure processing is carried out in the state that the semiconductor wafers and the plate-like anti-oxidizing body formed substantially in the same shape as said semiconductor wafers as viewed in plane are mixed in a wafer support capable of supporting a plurality of semiconductor wafers.

3. The high-temperature high-pressure processing method for semiconductor wafers according to claim 1, wherein said semiconductor wafers are film-formed in Cu.

4. The high-temperature high-pressure processing method for semiconductor wafers according to claim 2, wherein said semiconductor wafers are film-formed in Cu.

5. An anti-oxidizing body used for a high-temperature high-pressure processing method for semiconductor wafers, characterized in that a material having properties in which oxygen is apt to diffuse into interior is formed into a plate substantially in the same shape as the semiconductor wafers as viewed in plane.

6. The anti-oxidizing body according to claim 5, wherein mirror polishing processing is applied to said body.

7. The anti-oxidizing body according to claim 5, wherein coating is applied to the whole or a part of one surface out of both surfaces of the plate.

8. The anti-oxidizing body according to claim 6, wherein coating is applied to the whole or a part of one surface out of both surfaces of the plate.

9. The anti-oxidizing body according to claim 5, wherein said body is formed of titanium or a titanium alloy or zirconium or a zirconium alloy.

10. The anti-oxidizing body according to claim 6, wherein said body is formed of titanium or a titanium alloy or zirconium or a zirconium alloy.

11. The anti-oxidizing body according to claim 7, wherein said body is formed of titanium or a titanium alloy or zirconium or a zirconium alloy.

12. The anti-oxidizing body according to claim 8, wherein said body is formed of titanium or a titanium alloy or zirconium or a zirconium alloy.

* * * * *